(12) United States Patent
Lee et al.

(10) Patent No.: US 9,025,965 B2
(45) Date of Patent: May 5, 2015

(54) DIGITAL PHASE LOCKED LOOP HAVING INSENSITIVE JITTER CHARACTERISTIC FOR OPERATING CIRCUMSTANCES

(75) Inventors: Seung Woo Lee, Daejeon (KR); Kwang Chun Choi, Seoul (KR); Woo Young Choi, Seoul (KR); Bhum Cheol Lee, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 674 days.

(21) Appl. No.: 13/335,596

(22) Filed: Dec. 22, 2011

(65) Prior Publication Data

US 2012/0161834 A1    Jun. 28, 2012

(30) Foreign Application Priority Data

Dec. 23, 2010    (KR) .......................... 10-2010-0134034

(51) Int. Cl.
| | |
|---|---|
| *H04B 10/00* | (2013.01) |
| *H03L 1/00* | (2006.01) |
| *H03L 7/093* | (2006.01) |
| *H03L 7/099* | (2006.01) |

(52) U.S. Cl.
CPC *H03L 1/00* (2013.01); *H03L 7/093* (2013.01); *H03L 7/0998* (2013.01); *H03L 2207/06* (2013.01); *H03L 2207/50* (2013.01)

(58) Field of Classification Search
CPC ........ H04B 10/2507; H03L 7/06; H03L 7/08; H03L 7/00; H03L 7/085; H03L 7/093; H03L 7/099
USPC ................... 398/154, 155, 158, 159, 175, 66; 327/156, 157, 158, 159, 149, 147, 141; 331/14, 16, 17, 18, 25, 1 A; 375/376, 375/375, 373, 302
See application file for complete search history.

(56) References Cited

U.S. PATENT DOCUMENTS

| | | | |
|---|---|---|---|
| 2009/0052508 A1* | 2/2009 | Takahashi | ...................... 375/219 |
| 2009/0190694 A1* | 7/2009 | Kobayashi | .................... 375/302 |

* cited by examiner

*Primary Examiner* — Hanh Phan
(74) *Attorney, Agent, or Firm* — William Park & Associates Ltd.

(57) ABSTRACT

Disclosed are a phase locked loop (PLL) of a digital scheme and a method thereof. More specifically, disclosed are a digital phase locked loop having a time-to-digital converter (TDC), a digital loop filter (DLF), and a digitally controlled oscillator (DCO), and that is designed to have a constant jitter characteristic at all times even though an operating condition of a circuit varies according to a process, voltage, temperature (PVT) change, and a method thereof.

9 Claims, 5 Drawing Sheets

TDC: Time-to-Digital Converter
DLF: Digital Loop Filter
DCO: Digitally Controlled Oscillator

US 9,025,965 B2

DIGITAL PHASE LOCKED LOOP HAVING INSENSITIVE JITTER CHARACTERISTIC FOR OPERATING CIRCUMSTANCES

CROSS-REFERENCE TO RELATED APPLICATIONS

This application claims priority to and the benefit of Korean Patent Application No. 10-2010-0134034 filed in the Korean Intellectual Property Office on Dec. 23, 2011, the entire contents of which are incorporated herein by reference.

TECHNICAL FIELD

The present invention relates to a phase locked loop (PLL) of a digital scheme, and more particularly, to a digital phase locked loop that is designed to have a constant jitter characteristic at all times even though an operating condition of a circuit varies in response to a process, voltage, temperature change (hereinafter, abbreviated as "PVT change").

BACKGROUND ART

In general, a phase locked loop (generally, abbreviated as "PLL") is a circuit that receives a reference frequency signal from the outside, and receives a frequency signal which is generated in the circuit and thereby output through a negative feedback loop, and controls the input two frequency signals to be output as signals having the same phase or the same frequency and also minimizing the same phase difference. The phase locked loop is widely used for a communication system or digital equipment such as clock signal generation or recovery, frequency modulation, demodulation, synthesis, and distribution, and the like.

In the case of a clock or a frequency waveform output from the phase locked loop (PLL), an inconsistent phase occurs. This phenomenon is referred to as a jitter.

Due to several reasons, the jitter occurs. For example, the jitter occurs due to noise within a circuit constituting the phase locked loop, and the jitter included in a reference frequency waveform that is received as an input of the phase locked loop is reflected as is in an output frequency waveform.

In general, the phase locked loop has a low band pass filter characteristic with respect to an input phase and thus, a high frequency component in input jitter is attenuated, which is referred to as an input jitter reduction. However, in the input jitter, a predetermined frequency component is further amplified, which is an essential phenomenon in order to maintain the negative feedback stability of the phase locked loop. The above phenomenon is referred to as a jitter peaking phenomenon. The above jitter characteristic is determined by a phase gain according to a frequency, that is, a transfer function of the phase locked loop during a process in which the input phase of the phase locked loop is transferred as an output phase.

When a bandwidth of the transfer function is small, a greater amount of input jitter may be reduced. However, on the contrary, when the bandwidth of the transfer function is larger, a low frequency jitter occurring due to noise within the circuit of the phase locked loop is further reduced. Also, in a frequency around a bandwidth of the transfer function, a gain becomes at least '1' and thus, the input jitter is amplified. The smaller the gain, the smaller the jitter peaking phenomenon becomes. Therefore, it is very important to optimize the transfer function of the phase locked loop according to an application field. In particular, the above jitter characteristic is gaining importance in various application fields, such as optical communication, audio, universal serial bus (USB) communication, and the like, in which jitter is important.

In this instance, in the case of a phase locked loop of an analog scheme, the jitter characteristic is determined according to a current amount of a charge pump, a characteristic of a loop filter, a frequency gain (Hz/V) characteristic of a voltage controlled oscillator (VCO), and the like. The characteristic of the loop filter or the frequency gain characteristic of the VCO sensitively varies according to a process, voltage, temperature (PVT) change and thus, it is not easy to configure the jitter characteristic of the phase locked loop as accurately as a designer desires.

Accordingly, with recent development of a complementary metal-oxide semiconductor (CMOS) process technology, a digital phase locked loop in which the phase locked loop is configured using a digital logic circuit has been developed. A general structure of the digital phase locked loop is shown in FIG. 1.

As shown in FIG. 1, the digital phase locked loop generally includes a time-to-digital converter (TDC), a digital loop filter (DLF), and a digitally controlled oscillator (DCO). The TDC is a block to output a digital signal having a value proportional to a phase difference between two input clocks, and performs the same function as a phase detector of an analog phase locked loop.

In the DLF, both an input signal and an output signal are digital signals and a low band pass filtering function such as a loop filter of the analog phase locked loop is configured using a digital logic.

Also, the analog phase locked loop uses a VCO with varying oscillation frequencies according to an output voltage of the loop filter. On the other hand, the digital phase locked loop uses the DCO with varying oscillation frequencies according to a digital signal that is received as an output of the DLF.

Here, as shown in FIG. 1, the digital phase locked loop also has a feedback circuit in the same structure as the analog phase locked loop. Therefore, similar to a jitter characteristic of the analog phase locked loop that may be determined by an equation of Ip (a current amount of a charge pump), Kvco (a frequency gain of the VCO), $C_{LPF}$ (a capacitor value of the loop filter), and $R_{LPF}$ (a resistance value of the loop filter), a jitter characteristic of the digital phase locked loop may also be determined as an equation based on a characteristic value of each block.

That is, in the case of the characteristic value of each block, the TDC is a resolution ($\Delta_{TDC}$) of the TDC that is a digital code output characteristic as compared to a phase difference between two input signals. The DLF is a z-domain transfer function, and the DCO has a characteristic value of ($K_{DCO}$) in which an oscillation frequency varies when the digital code varies.

Here, the resolution ($\Delta_{TDC}$) of the TDC may be designed to be constant at all times in order to be insensitive to) a PVT change using a TDC of a known structure. The DLF is a circuit that includes a digital adder and a digital multiplier and thus, is not affected by the PVT change.

However, regardless of a structure of the DCO, the $K_{DCO}$ characteristic of the DCO is sensitive to the PVT change. In general, a complex plurality of factors work together and thereby affect the $K_{DCO}$ characteristic and thus, it is not easy to estimate the characteristic of $K_{DCO}$.

SUMMARY OF THE INVENTION

The present invention has been made in an effort to provide a digital phase locked loop that uses a digitally controlled oscillator (DCO) in a structure capable of estimating a change in a characteristic of $K_{DCO}$ according to a process, voltage, temperature (PVT) change.

The present invention has been made in an effort to provide a digital phase locked loop having a constant jitter characteristic at all times by estimating a change in a characteristic of a DCO when the characteristic of the DCO changes according to the PVT change, and by adjusting a coefficient value of a digital loop filter (DLF) to reduce the whole loop-dynamics change according to the change in the DCO characteristic.

An exemplary embodiment of the present invention provides a digital phase locked loop having a time-to-digital converter (TDC), a digital loop filter (DLF), and a DCO, including: a DCO gain estimator to calculate a frequency gain of the DCO; and a DLF compensator to adjust a loop filter coefficient of the DLF, wherein the digital phase locked loop has a constant jitter characteristic even when an operating condition varies according to a PVT change, and the DCO is designed to have only a single variable that affects a frequency gain according to the PVT change.

Calculation of the frequency gain using the DCO gain estimator is to initialize the loop filter coefficient based on a resolution and a division coefficient of the TDC, to wait until a phase locked loop is fixed and then to calculate the frequency gain based on a fixed digital code value when an oscillation frequency is fixed and the digital code value is fixed to a digital code value corresponding to the oscillation frequency.

When the frequency gain of the DCO is calculated by the DCO gain estimator, the DLF compensator compensates for a loop-dynamics change occurring due to a change in a characteristic of the DCO by calculating a difference between the calculated frequency gain and an estimated frequency gain and by adjusting the loop filter coefficient, and thereby adjusts the loop filter coefficient of the DLF.

The DCO gain estimator and the DLF compensator perform compensation of the loop-dynamics change through calculation of the frequency gain and adjustment of the loop filter coefficient repeatedly at predetermined intervals, to have constant loop-dynamics at all times regardless of the PVT change.

An example of the DCO is in a structure in which a plurality of delay cell modules are connected in series and each of the delay cell modules may be configured to connect delay cells, having the same input node and having a different delay time, in parallel to each other and add up the delay cells and then transfer an addition result to a delay cell module of a subsequent end.

As an example of the DCO gain estimator, to calculate the frequency gain of the DCO, when adding up the delay cells of the DCO that are connected in parallel to each other, each delay cell module may add up the delay cells by changing path weights of delay cells connected in parallel to both sides of a delay cell to be different from each other using an interpolator circuit.

An example of the interpolator circuit may be a circuit in which a voltage gain is adjusted with respect to two differential input current sources based on magnitudes of current of both sides.

Another exemplary embodiment of the present invention provides a method of configuring a digital phase locked loop, including a TDC, a DLF, and a DCO, which are insensitive to a PVT change or capable of estimating the PVT change to thereby compensate for a change in the characteristic, to have an insensitive jitter characteristic for operating circumstances, the method including: designing the DCO to have only a single variable that affects a frequency gain according to a PVT change; calculating a frequency gain of the DCO; and adjusting a loop filter coefficient of the DLF.

The calculating of the frequency gain of the DCO initializes the loop filter coefficient based on a resolution and a division coefficient of the TDC, waits until a phase locked loop is fixed and then calculates the frequency gain based on a fixed digital code value when an oscillation frequency is fixed and the digital code value is fixed to a digital code value corresponding to the oscillation frequency.

When the frequency gain of the DCO is calculated, the adjusting of the loop filter coefficient of the DLF compensates for a loop-dynamics change occurring due to a change in a characteristic of the DCO by calculating a difference between the calculated frequency gain and an estimated frequency gain and by adjusting the loop filter coefficient, and thereby adjusts the loop filter coefficient of the DLF.

By performing compensation of the loop-dynamics change through calculation of the frequency gain and adjustment of the loop filter coefficient repeatedly at predetermined intervals, even though the PVT change varies, constant loop-dynamics may be maintained at all times.

A digital phase locked loop configured as above and a method thereof according to exemplary embodiments of the present invention includes a TDC insensitive to a PVT change, a DLF, a DCO capable of estimating the affect from the PVT change, and a compensator for adjusting a coefficient of the DLF according to a DCO characteristic. Therefore, it is possible to provide a digital phase locked loop having a jitter characteristic that is insensitive to the PVT change.

The foregoing summary is illustrative only and is not intended to be in any way limiting. In addition to the illustrative aspects, embodiments, and features described above, further aspects, embodiments, and features will become apparent by reference to the drawings and the following detailed description.

Figure 1:
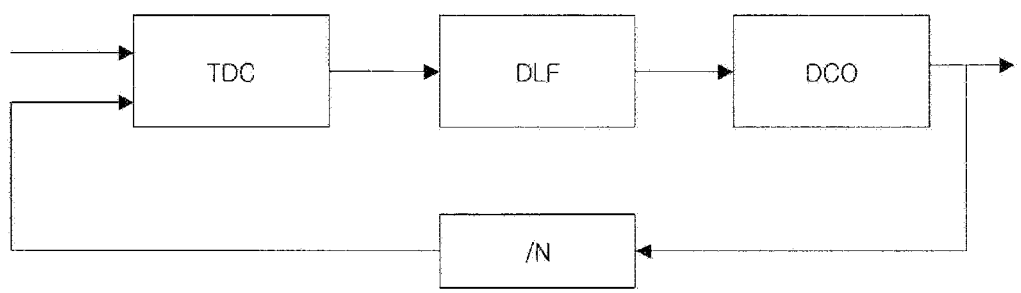
FIG. 1 is a block diagram of a general digital phase locked loop.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Hereinafter, exemplary embodiments of the present invention will be described in detail with reference to the accompanying drawings. First of all, we should note that in giving reference numerals to elements of each drawing, like reference numerals refer to like elements even though like elements are shown in different drawings. In describing the present invention, well-known functions or constructions will not be described in detail since they may unnecessarily obscure the understanding of the present invention. It should be understood that although exemplary embodiment of the present invention are described hereafter, the spirit of the present invention is not limited thereto and may be changed and modified in various ways by those skilled in the art.

Figure 2:
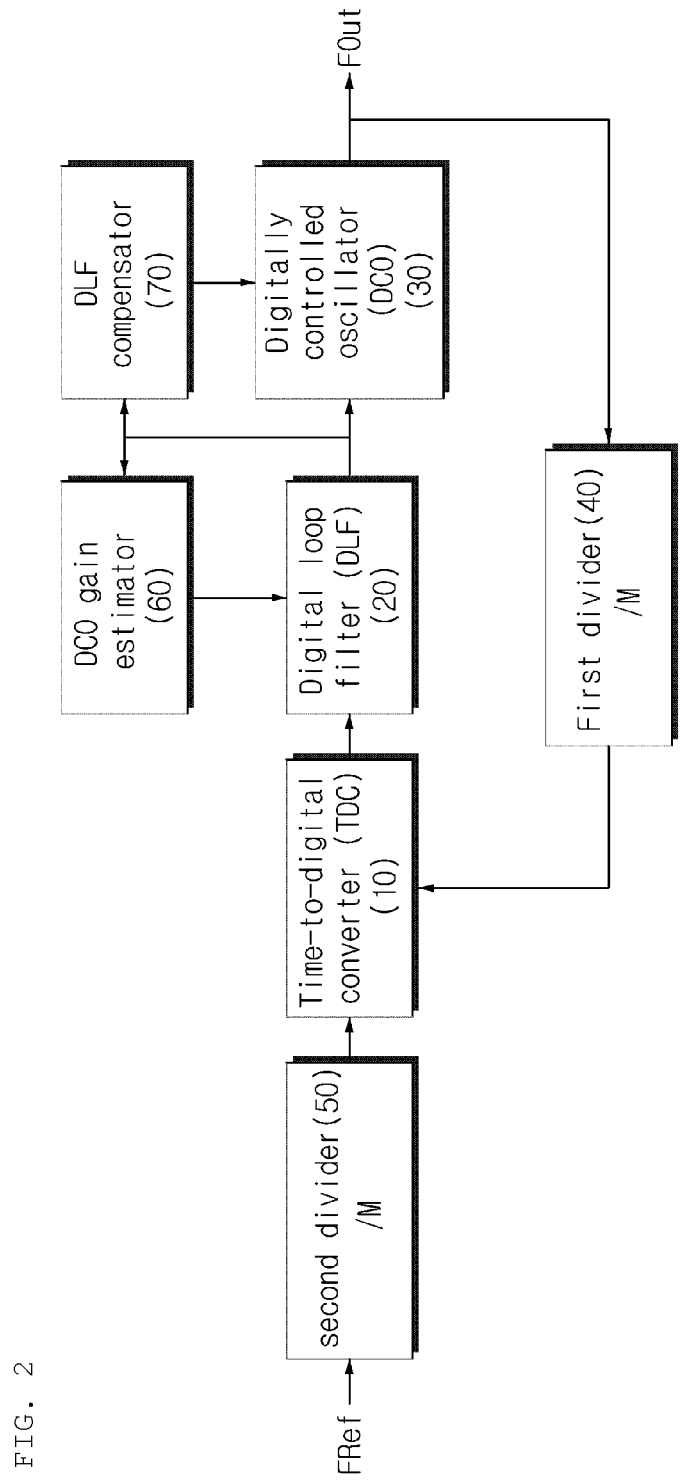
FIG. 2 is a block diagram of a digital phase locked loop according to the present invention.

FIG. 2 is a block diagram of a digital phase locked loop according to the present invention.

The digital phase locked loop according to the present invention basically includes a time-to-digital converter (TDC) 10, a digital loop filter (DLF) 20, and a digitally controlled oscillator (DCO) 30, which are basic constituent elements of a digital phase locked loop described above with reference to FIG. 1.

As described above, the TDC 10 performs the same function as a detector of an analog phase locked loop and thus, compares a phase and a frequency of a reference input clock (FRef), received as an input, with a phase and a frequency of an output clock (FOut/N) that is input from a first divider 40 and is divided by a predetermined division value N, and outputs a digital signal proportional to a phase difference and a frequency difference between two clocks.

The DLF 20 configures a low band pass filter function using a digital logic. When a digital signal generated in the TDC 10 is greater than an allowable error value, the DLF 20 adjusts a control value for controlling a phase and a frequency of a current output clock (FOut) based on an error value and outputs the adjusted control value to the DCO 30.

The DCO 30 generates the output clock (FOut) by controlling a phase and a frequency of a clock, output from a frequency oscillator, according to the adjusted control value that is output from the DLF 20.

The digital phase locked loop according to the present invention includes the first divider 40 to divide a clock (FOut) output from the DCO 30 by the predetermined division value (N) and to feed back the divided clock to the TDC 10.

The first divider 40 enables the TDC 10 to repeatedly compare the phase and the frequency of the reference input clock (FRef) with the phase and the frequency of the output clock (FOut).

The digital phase locked loop includes a second divider 50 to divide the reference input clock (FRef) by a predetermined division value M and to input the divided reference input clock into the TDC 10.

The division value N of the first divider 40 and the division value M of the second divider 50 are real numbers greater than or equal to '1' and may use an integer or a real-numbered division value depending on necessity. When using the real-numbered division value, it is possible to precisely adjust a frequency.

The first divider 40 or the second divider 50 is a constituent element required only when using a phase locked loop for a frequency synthesizer. Depending on necessity, only one of the first divider 40 and the second divider 50 may be included, or both the first divider 40 and the second divider 50 may be omitted.

The digital phase locked loop according to the present invention further includes a DCO gain estimator 60 and a DLF compensator 70. Configurations thereof will be described below.

As described above, the TDC 10 of the digital phase locked loop according to the present invention employs a TDC that is insensitive to a PVT change or a TDC in a known structure capable of compensating for a change in a characteristic by estimating the PVT change.

The DLF 20 also includes the digital adder and the digital multiplier and thus, it is possible to easily change a characteristic of the DLF 20 by only changing a digital coefficient to be multiplied with a signal.

Therefore, the TDC 10 and the DLF 20 may be designed to be insensitive to the PVT change using the known structure and thus, a detailed description relating thereto will be omitted here.

However, as described above, in the case of the DCO 30, the $K_{DCO}$ characteristic, which is the frequency gain, is sensitive to the PVT change and a complex plurality of factors work together and thereby affect the $K_{DCO}$ characteristic and thus, it is not easy to estimate the characteristic of $K_{DCO}$.

For example, when configuring the DCO 30 by combining a digital-to-analog converter (DAC) of a general structure and a voltage controlled oscillator (VCO) in a ring type, each of the output resistance of a delay cell constituting the ring, a parasitic capacitance connected in parallel, trans-conductance of a transistor controlling current, and the like varies according to the PVT change. Therefore, a plurality of variables may occur and thus, it may not be easy to estimate how a characteristic value of $K_{DCO}$ that is the frequency gain will be changed from a value intended in a design stage.

Figure 3:
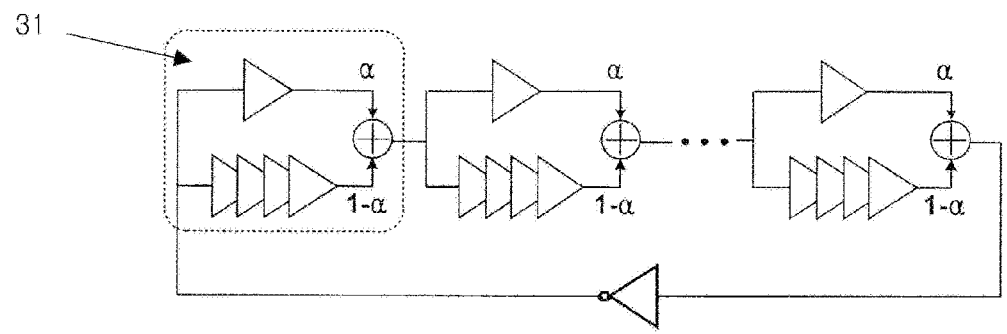
FIG. 3 is a circuit diagram of a digitally controlled oscillator (DCO) according to an exemplary embodiment of the present invention.

Accordingly, the present invention designs the DCO 30 to have only a single variable that affects the frequency gain $K_{DCO}$ according to the PVT change. FIG. 3 is an exemplary embodiment of the DCO 30 configured as above.

When using the DCO 30 of FIG. 3 according to an exemplary embodiment of the present invention, the frequency gain $K_{DCO}$ may be defined as a function having a single variable.

That is, the DCO 30 according to the exemplary embodiment of the present invention is configured in a structure in which a plurality of delay cell modules 31 are connected in series. Each of the delay cell modules 31 is configured to connect delays cells, having the same input node and having a different delay time, in parallel to each other and add up the delay cells and then transfer an addition result to a delay cell module of a subsequent end.

When adding up the delay cells that are connected in parallel to each other, each delay cell module 31 adds up the delay cells by changing path weights ($\alpha$ and $1-\alpha$) of delay cells connected in parallel to both sides of a delay cell to be different from each other using an interpolator circuit.

Figure 4:
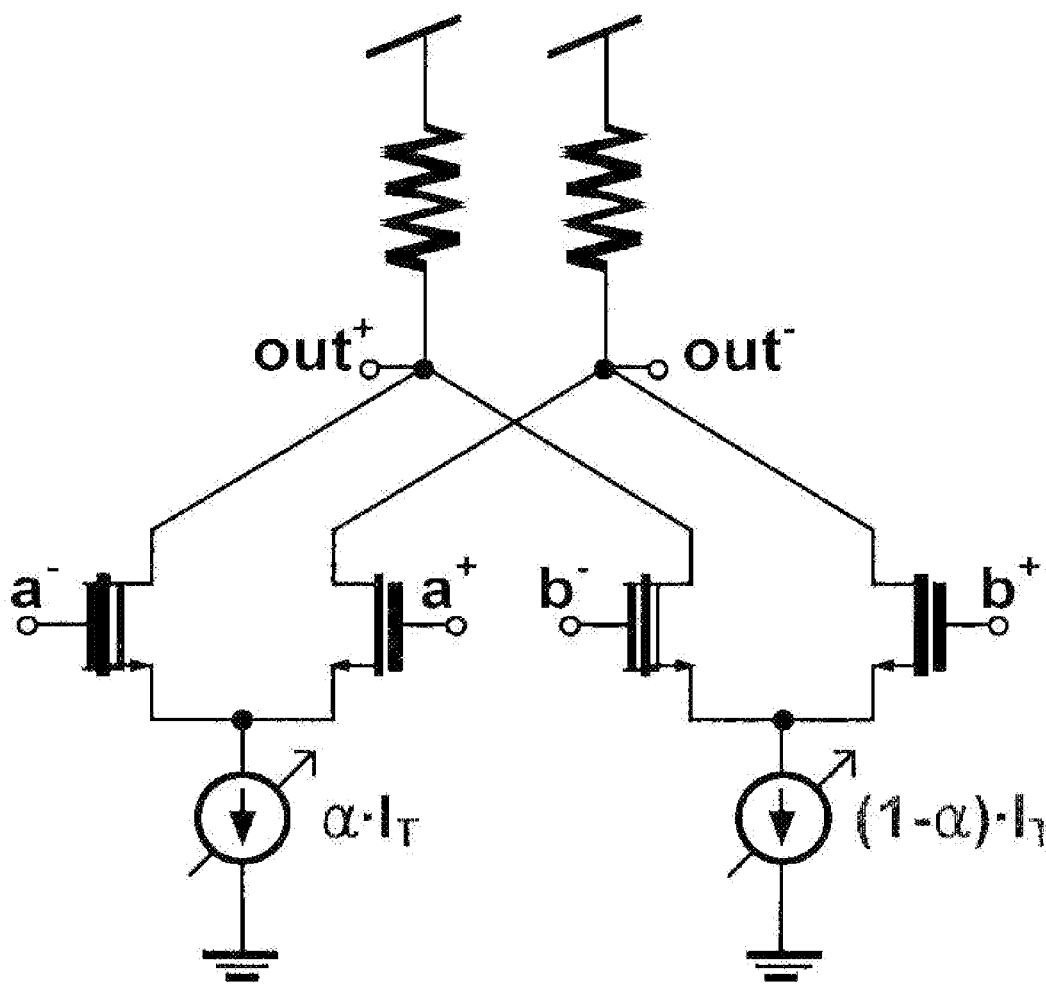
FIG. 4 is a circuit diagram of an interpolator according to an exemplary embodiment of the present invention.

An interpolator circuit of FIG. 4 may be used as the interpolator circuit. The interpolator circuit of FIG. 4 is a circuit in which a voltage gain is adjusted with respect to two differential input current sources (a and b) based on magnitudes of current of both sides. Here, $I_T$ is a current value of a reference current source.

Figure 5:
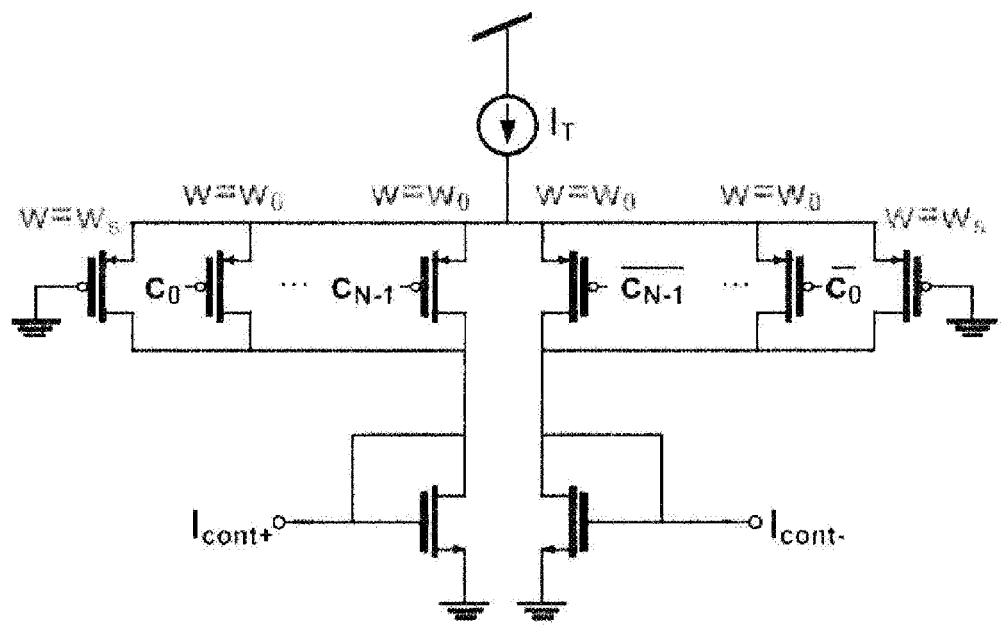
FIG. 5 is a circuit diagram of a digital-to-analog current converting circuit in which a plurality of p-channel metal oxide semiconductors (PMOSs) for receiving current of a reference current source of $I_T$ are connected in parallel according to an exemplary embodiment of the present invention.

Here, according to an exemplary embodiment of the present invention, to adjust the magnitudes of current of two differential input current sources (a and b) that are input into the interpolator circuit, it is possible to use a digital-to-analog current converting circuit in which a plurality of PMOSs for receiving current of the reference current source $I_T$ are connected in parallel, as shown in FIG. 5.

Here, $W_S$ denotes a width of a PMOS that is in a turn-on state at all times, each of $C_0$ to $C_{N-1}$ denotes an input signal code value, $W_0$ denotes a width of a PMOS switching between a turn-on state and a turn-off state based on the input signal code value, and Icont+ and Icont− denote a positive output current and a negative output current of the current source, respectively.

The magnitudes of two current sources (a and b) output by the digital-to-analog current converting circuit may be calculated according to the following Equation 1:

$$I_{cont+} = \frac{1}{2} \cdot I_T + \frac{W_0 \cdot I_T}{2W_s} \cdot \text{code} = \alpha \cdot I_T \quad \text{[Equation 1]}$$

$$I_{cont-} = \frac{1}{2} \cdot I_T - \frac{W_0 \cdot I_T}{2W_s} \cdot \text{code} = (1-\alpha) \cdot I_T$$

Figure 6:
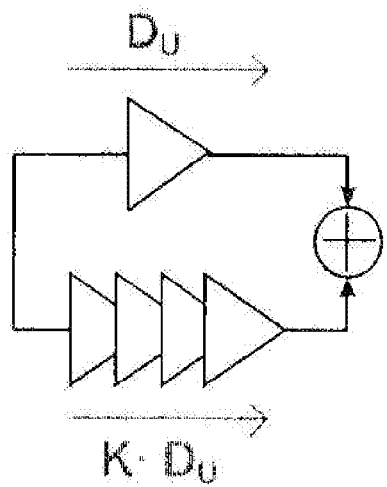
FIG. 6 is a diagram illustrating a delay cell module of one end.

Accordingly, it is possible to calculate the delay time of the delay cell module 31 of one end of FIG. 3 using Equation 1. FIG. 6 shows the delay cell module 31 of one end. Between two groups of delay cell modules 31 connected in parallel, when a delay time of a delay cell module group of one side having a smaller delay time is a unit delay time Du, a delay time of a delay cell module group of another side having a greater delay time is longer than Du by K folds. This delay time is calculated mathematically using K*Du.

Here, two groups of delay cell modules have the same circuit structure. When it is assumed that the PVT change is applied alike to the delay cell modules of two groups, the value of K that is a proportional constant of the delay time is not affected by the PVT change.

Accordingly, the delay time of one end has a maximum value of K*Du and has a minimum value of Du and thus, has a value between the maximum value and the minimum value in proportion to weights ($\alpha$ and $1-\alpha$) of the interpolator.

Accordingly, a total delay time may be calculated according to Equation 2:

$$\text{Delay} = (D_U \cdot \alpha + K \cdot D_U \cdot (1-\alpha)) \quad \text{[Equation 2]}$$

$$= \frac{(D_U \cdot \alpha I_T + K \cdot D_U \cdot (1-\alpha)I_T)}{I_T}$$

$$= \frac{(D_u \cdot I_{cont+} + K \cdot D_u \cdot I_{cont-})}{I_{cont+} + I_{cont-}}$$

$$= \frac{1}{2} D_U \times \left((1+K) + (1-K)\frac{W_0}{W_s} \cdot \text{code}\right)$$

When a total of N delay cell modules constitute an oscillator, an oscillation frequency (freq) of the DCO 30 according to the present invention may be calculated according to Equation 3:

$$\text{freq} = \frac{1}{N} \times \frac{2}{D_u} \times \frac{1}{(1+K) + (1-K)\frac{W_0}{W_s} \cdot \text{code}} \quad \text{[Equation 3]}$$

In Equation 3, the total number N of delay cell modules, the proportional constant K of the delay time, $W_0$, and $W_s$ are values all determined when designing the DCO 30 according to the present invention. The above values are not affected by the PVT change.

Therefore, in Equation 3, a variable affected by the PVT change is the unit delay time Du. Accordingly, the oscillation frequency (freq) of the DCO 30 according to the present invention and the frequency gain $K_{DCO}$ may be calculated using the digital code value (code) and the unit delay time Du value of the delay cell.

The above result satisfies a condition that the DCO 30 of the present invention has only a single variable affecting the frequency gain $K_{DCO}$ of the DCO 30.

Here, a method of estimating the unit delay time Du in Equation 3 is as follows. That is, the frequency gain $K_{DCO}$ of the DCO 30 of which the characteristic is changed due to the PVT change cannot be known in an initial stage and thus, the frequency gain is approximately assumed through a simulation.

A loop filter coefficient is initialized as an appropriate value based on a resolution and a division coefficient of the TDC 10 and a sufficient amount of time is waited for until a phase locked loop is fixed to a desired frequency.

Next, after the phase is fixed, all of the variables excluding Du in the above equation are determined. That is, the oscillation frequency is fixed and the digital code value (code) is fixed to a digital code value corresponding to the oscillation frequency.

Next, when the unit delay time Du value is calculated using a logic of a digital signal processor (DSP), Du that is an unknown quantity value in Equation 3 is calculated. When the digital code value (code) is differentiated by a variable, the frequency gain $K_{DCO}$ of the DCO 30 of the present invention may be calculated.

Next, after the phase is fixed, all of variables excluding Du in the above equation are determined. That is, the oscillation frequency is fixed and the digital code value (code) is fixed to a digital code value corresponding to the oscillation frequency.

Here, to accurately calculate a differentiation value of the digital code value (code), a large number of operations are required. Therefore, when making an equation simple by folding the equation using Taylor series and then discarding terms greater than a fourth order, the equation may be arranged to Equation 4:

$$\text{freq} = \frac{1}{D_u} \cdot \frac{2}{N \cdot (1+K)} \times \quad \text{[Equation 4]}$$

$$\frac{1}{1 + \frac{1-K}{1+K} \cdot \frac{W_0}{W_s} \cdot \text{code}}, \quad C = \frac{1-K}{1+K} \cdot \frac{W_0}{W_s}$$

$$\approx \frac{1}{D_U} \cdot \frac{2}{N \cdot (1+K)} \times$$

$$\{1 - C \cdot \text{code} + C^2 \cdot \text{code}^2 - C^3 \cdot \text{code}^3\}$$

$$K_{DCO} = \frac{\Delta \text{freq}}{\Delta \text{code}} \approx \frac{1}{D_U} \cdot \frac{2}{N \cdot (1+K)} \times$$

$$\{-C + 2C^2 \cdot \text{code} - 3C^3 \cdot \text{code}^2\}$$

In Equation 4, a value of C is determined by the total number N of delay cell modules, the proportional constant K of the delay time, $W_O$, and Ws when designing the DCO 30 according to the present invention.

Next, when the frequency gain $K_{DCO}$ of the DCO 30 is calculated according to Equation 4, a loop-dynamics change occurring due to a change in the characteristic of the DCO 30 is compensated for by calculating a difference between the calculated frequency gain and the estimated frequency gain and by adjusting the loop filter coefficient.

Calculation of the frequency gain is performed by the DCO gain estimator 60 according to the present invention. Adjustment of the loop filter coefficient of the DLF 20 is performed by the DLF compensator 70 according to the present invention. When the DCO gain estimator 60 and the DLF compensator 70 perform compensation of the loop-dynamics change through calculation of the frequency gain and adjustment of the loop filter coefficient repeatedly at predetermined intervals, it is possible to have constant loop-dynamics at all times even though the PVT change varies over time. In general, since the PVT change does not significantly vary over time, an operational speed of the DLF compensator 70 has no need to be fast.

Meanwhile, a method of enabling the digital phase locked loop to have an insensitive jitter characteristic for operating circumstances according to the present invention will be described.

The method of enabling the digital phase locked loop to have the insensitive jitter characteristic for operating circumstances is a method of enabling the digital phase locked loop to have a constant jitter characteristic at all times even though an operation condition of a circuit varies according to the PVT change as described above.

The method of the present invention is presumed as a method that is configured in a digital phase locked loop including a TDC, a DLF, and a DCO, as described above, in which the TDC employs a known TDC that may be insensitive to the PVT change or may compensate for a change in the characteristic by estimating the PVT change.

That is, the method of the present invention may include designing the TDC to have only a single variable affecting a frequency gain according to the PVT change, calculating the frequency gain of the DCO, and adjusting a loop filter coefficient of the DLF.

Here, as described above, the calculating of the frequency gain of the DCO, initializes the loop filter coefficient based on a resolution and a division coefficient of the TDC, waits until a phase locked loop is fixed and then calculates the frequency gain based on a fixed digital code value when an oscillation frequency is fixed and the digital code value is fixed to a digital code value corresponding to the oscillation frequency.

As described above, when the frequency gain of the DCO is calculated, the adjusting of the loop filter coefficient of the DLF compensates for a loop-dynamics change occurring due to a change in a characteristic of the DCO by calculating a difference between the calculated frequency gain and an estimated frequency gain and by adjusting the loop filter coefficient, and thereby adjusts the loop filter coefficient of the DLF.

Compensation of the loop-dynamics change through calculation of the frequency gain and adjustment of the loop filter coefficient is performed repeatedly at predetermined intervals. Therefore, even though the PVT change varies, it is possible to obtain a constant loop-dynamics at all times.

Figure 7:
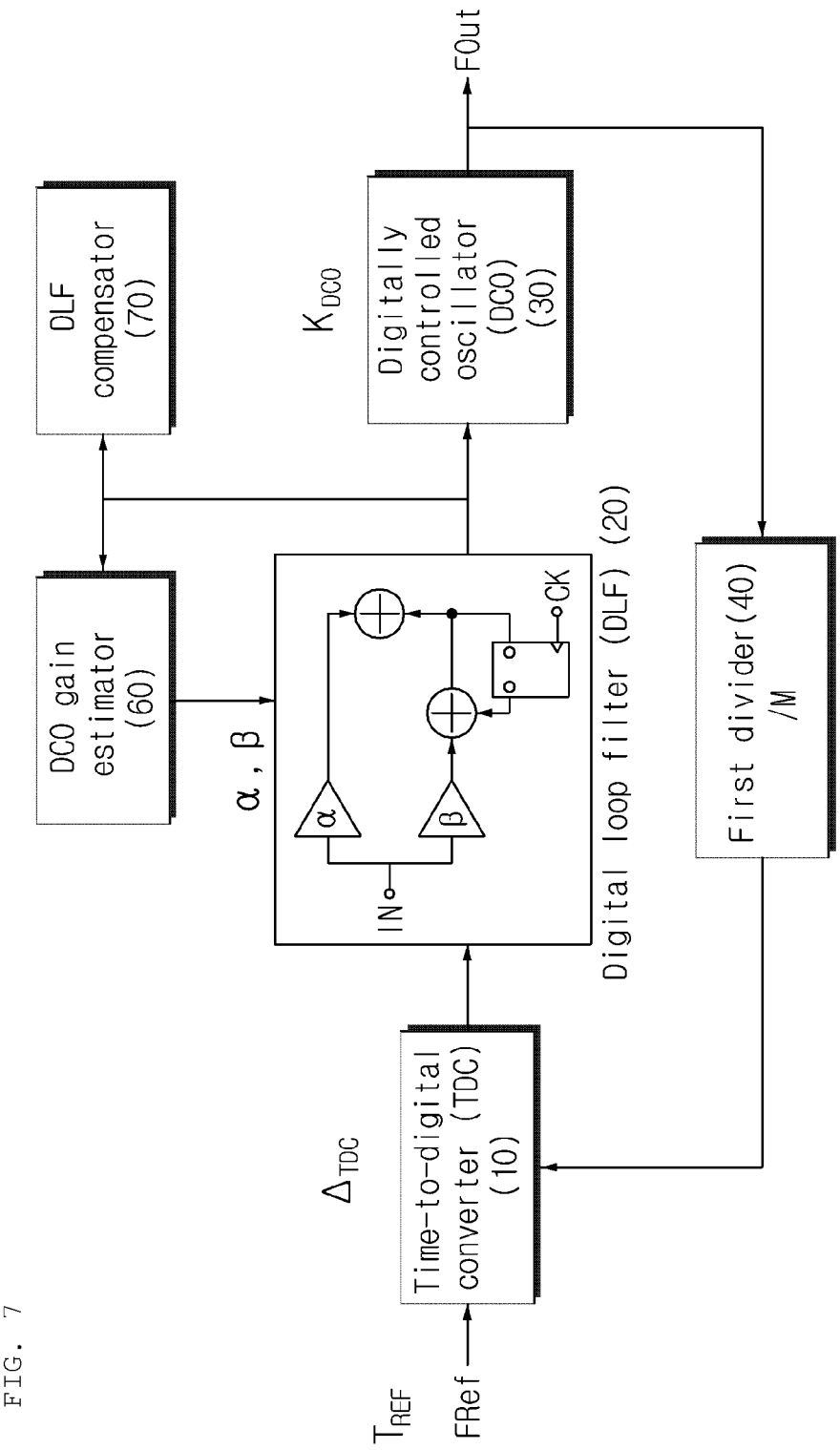
FIG. 7 is a block diagram of a digital phase locked loop using a primary infinite impulse response (IIR) filter capable of readily performing small-signal analysis according to an exemplary embodiment of the present invention.

FIG. 7 illustrates a digital phase locked loop using, as the DLF 20, a primary infinite impulse response (IIR) filter capable of simply and readily performing small-signal analysis according to an exemplary embodiment of the present invention. In the present exemplary embodiment, a divider of a reference clock (FRef) is omitted to simply perform the signal analysis.

In the exemplary embodiment, it is assumed that the primary IIR filter capable of simply and readily performing (mall-signal analysis is used as the DLF 20, a period of the input reference clock is $T_{REF}$, a division coefficient is N, and a resolution of the TDC 10 is $\Delta_{TDC}$.

The frequency gain $K_{DCO}$ value of the DCO 30 uses a value calculated by the DCO gain estimator 60 having the aforementioned algorithm.

Here, filter coefficients of the DLF 20, that is, values of $\alpha$ and $\beta$ are calculated by the DLF compensator 70 according to Equation 5:

$$\omega_Z = \frac{\omega_{UGBW}}{\tan(PM)} \quad \text{[Equation 5]}$$

$$R = \frac{2\pi N \Delta_{TDC}}{T_{REF} K_{DCO}} \frac{\omega_Z^2}{\sqrt{\omega_Z^2 + \omega_{UGBW}^2}} \quad \alpha = R - \frac{T_{REF}}{2C}$$

$$C = \frac{\tan(PM)}{R\omega_{UGBW}} \quad \beta = \frac{T_{REF}}{C}$$

In Equation 5, values of $\alpha$ and $\beta$ that are filter coefficients of the DLF 20 are calculated based on given coefficients, that is, $T_{REF}$, the division coefficient N, the resolution $\Delta_{TDC}$ of the TDC 10, the frequency gain $K_{DCO}$, a phase margin PM, and a unit gain bandwidth $\omega$UGBW.

Accordingly, it is possible to estimate the $K_{DCO}$ characteristic, which has been sensitive to the PVT change in the related art, using the frequency gain $K_{DCO}$ that is calculated by the DCO gain estimator 60 and the DLF compensator 70 according to the present invention. In addition, values of $\alpha$ and $\beta$ that are filter coefficients of the DLF 20 may be set. Therefore, even though the frequency gain $K_{DCO}$ changes due to a change in a PVT condition, the DLF 20 is updated by estimating the frequency gain $K_{DCO}$ using the DCO gain estimator 60 and the DLF compensator 70, and by calculating a new filter coefficient based on the estimated frequency gain $K_{DCO}$. Therefore, the digital phase locked loop of the present invention may maintain a constant jitter characteristic at all times.

Here, the filter coefficient of the digital phase locked loop according to the present invention may also be updated slowly regardless of an operation speed of the phase locked loop. In the exemplary embodiment of FIG. 7, the primary IIR filter in a relatively simple form is employed as the DLF 20. However, even though a more complex filter is used for more precise control, it is possible to maintain the constant jitter characteristic at all times by applying algorithms of the aforementioned DCO gain estimator 60 and DLF compensator 70 of the present invention using the same method.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A digital phase locked loop having a time-to-digital converter (TDC), a digital loop filter (DLF), and a digital controlled oscillator (DCO), comprising:
   a DCO gain estimator to calculate a frequency gain of the DCO; and
   a DLF compensator to adjust a loop filter coefficient of the DLF,
   wherein the digital phase locked loop has a constant jitter characteristic even when an operating condition varies according to a phase, voltage, temperature (PVT) change, and
   the DCO is designed to have only a single variable that affects a frequency gain according to the PVT change,
   wherein the DCO is in a structure in which a plurality of delay cell modules are connected in series and each of the delay cell modules is configured to connect delay cells, having the same input node and having a different delay time, in parallel to each other and add up the delay cells and then transfer an addition result to a delay cell module of a subsequent end.

2. The digital phase locked loop of claim 1, wherein when the frequency gain of the DCO is calculated by the DCO gain estimator, the DLF compensator compensates for a loop-dynamics change occurring due to a change in a characteristic of the DCO by calculating a difference between the calculated frequency gain and an estimated frequency gain and by adjusting the loop filter coefficient, and thereby adjusts the loop filter coefficient of the DLF.

3. The digital phase locked loop of claim 2, wherein the DCO gain estimator and the DLF compensator perform compensation of the loop-dynamics change through calculation of the frequency gain and adjustment of the loop filter coefficient repeatedly at predetermined intervals, to have constant loop-dynamics at all times regardless of the PVT change.

4. The digital phase clocked loop of claim 1, wherein when adding up the delay cells of the DCO, connected in parallel to each other, for the DCO gain estimator to calculate the frequency gain of the DCO, each delay cell module adds up the delay cells by changing path weights of delay cells connected in parallel to both sides of a delay cell to be different from each other using an interpolator circuit.

5. The digital phase locked loop of claim 4, wherein the interpolator circuit is a circuit in which a voltage gain is adjusted with respect to two differential input current sources based on magnitudes of current of both sides.

6. A digital phase locked loop having a time-to-digital converter (TDC), a digital loop filter (DLF), and a digital controlled oscillator (DCO), comprising:
   a DCO gain estimator to calculate a frequency gain of the DCO; and
   a DLF compensator to adjust a loop filter coefficient of the DLF,
   wherein the digital phase locked loop has a constant Utter characteristic even when an operating condition varies according to a phase, voltage, temperature (PVT) change, and
   the DCO is designed to have only a single variable that affects a frequency gain according to the PVT change,
   wherein calculation of the frequency gain using the DCO gain estimator is to initialize the loop filter coefficient based on a resolution and a division coefficient of the TDC, to wait until a phase locked loop is fixed and then to calculate the frequency gain based on a fixed digital code value when an oscillation frequency is fixed and the digital code value is fixed to a digital code value corresponding to the oscillation frequency.

7. A method of configuring a digital phase locked loop, comprising a TDC, a DLF, and a DCO, to have an insensitive jitter characteristic for operating circumstances, the method comprising:
   designing the DCO to have only a single variable that affects a frequency gain according to a PVT change;
   calculating a frequency gain of the DCO; and
   adjusting a loop filter coefficient of the DLF,
   wherein the calculating of the frequency gain of the DCO initializes the loop filter coefficient based on a resolution and a division coefficient of the TDC, waits until a phase locked loop is fixed and then calculates the frequency gain based on a fixed digital code value when an oscillation frequency is fixed and the digital code value is fixed to a digital code value corresponding to the oscillation frequency.

8. The method of claim 7, wherein when the frequency gain of the DCO is calculated, the adjusting of the loop filter coefficient of the DLF compensates for a loop-dynamics change occurring due to a change in a characteristic of the DCO by calculating a difference between the calculated frequency gain and an estimated frequency gain and by adjusting the loop filter coefficient, and thereby adjusts the loop filter coefficient of the DLF.

9. The method of claim 8, wherein the adjusting of the loop filter coefficient of the DLF performs compensation of the loop-dynamics change through calculation of the frequency gain and adjustment of the loop filter coefficient repeatedly at predetermined intervals, to have constant loop-dynamics at all times regardless of the PVT change.

* * * * *